United States Patent
Ginley et al.

(10) Patent No.: US 11,680,476 B2
(45) Date of Patent: Jun. 20, 2023

(54) HIGH TEMPERATURE AND HIGH PRESSURE ALGAN/GAN ELECTRONICS

(71) Applicant: Alliance for Sustainable Energy, LLC, Golden, CO (US)

(72) Inventors: David Samuel Ginley, Evergreen, CO (US); Philip Anthony Parilla, Lakewood, CO (US); Daniel Joseph Friedman, Lakewood, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 565 days.

(21) Appl. No.: 16/715,877

(22) Filed: Dec. 16, 2019

(65) Prior Publication Data

US 2020/0190962 A1 Jun. 18, 2020

Related U.S. Application Data

(60) Provisional application No. 62/780,018, filed on Dec. 14, 2018.

(51) Int. Cl.
| | | |
|---|---|---|
| *E21B 47/00* | (2012.01) | |
| *H01L 29/778* | (2006.01) | |
| *E21B 47/022* | (2012.01) | |
| *G01D 21/02* | (2006.01) | |
| *H01L 29/267* | (2006.01) | |
| *H01L 29/205* | (2006.01) | |
| *H01L 29/20* | (2006.01) | |

(52) U.S. Cl.
CPC ............ *E21B 47/00* (2013.01); *E21B 47/022* (2013.01); *G01D 21/02* (2013.01); *H01L 29/7783* (2013.01); *H01L 29/7786* (2013.01); *H01L 29/2003* (2013.01); *H01L 29/205* (2013.01); *H01L 29/267* (2013.01)

(58) Field of Classification Search
CPC ... E21B 47/00; E21B 47/022; H01L 29/7783; H01L 29/7786
See application file for complete search history.

(56) References Cited

PUBLICATIONS

Chapin, C.A. et al., "InAlN/GaN high electron mobility micropressure sensors for high-temperature environments," Sensors and Actuators A: Physical, vol. 263, 2017, pp. 216-223.
Choi, M. et al., "Autonomous Microsystems for Downhole Applications: Design Challenges, Current State, and Initial Test Results," Sensors, vol. 17, 2017, 12 pages.
Corbin, W.C. et al., "Development of a Downhole Tool for Measuring Enthalpy inGeothermal Reservoirs," Proceedings, 42nd Workshop on Geothermal Reservoir Engineering, Stanford University, Stanford, California, Feb. 13-15, 2017, SGP-TR-212.
Greco, G. et al., "Temperature dependence of the I-V characteristics of Ni/Au Schottky contacts to AlGaN/GaN heterostructures grown on Si substrates," Phys. Status Solidi A, vol. 214, No. 9, 2017, 8 pages.
Ko, T.S. et al., "High-temperature carrier density and mobility enhancements in AlGaN/GaN HEMT using AlN spacer layer," Journal of Crystal Growth, vol. 464, 2017, pp. 175-179.

(Continued)

*Primary Examiner* — Anthony Ho
(74) *Attorney, Agent, or Firm* — Sam J. Barkley

(57) ABSTRACT

Disclosed herein are devices, systems and methods useful for downhole sensors and electronics suitable for harsh thermal and mechanical environment associated with high-temperature geothermal drilling and high-temperature/high-pressure oil and gas drilling.

8 Claims, 2 Drawing Sheets

(56) References Cited

PUBLICATIONS

Lalinsky, T. et al., "Ir/Al multilayer Gates for High Temperature Operated AlGaN/GaN HEMTs," Phys. Status Solidi A, vol. 214, 2017, 9 pages.

Maeda, N. et al., "High-Temperature Characteristics in Recessed-Gate AlGaN/GaN Enhancement-Mode Heterostructure Field Efffect Transistors with Enhanced-Barrier Structures," Japan Society of Applied Physics, vol. 52, 2013, 4 pages.

Sharma, N. et al., "Investigation of High-Temperature Effects on the Performance of AlGaN/GaN High Electron Mobility Transistors," Journal of Nanoelectronics and Optoelectronics, vol. 11, 2016, pp. 694-701.

So, H. et al., "Continuous V-Grooved A1GaN/GaN Surfaces for High-Temperature Ultraviolet Photodetectors," IEEE Sensors Journal, vol. 16, No. 10, May 15, 2016, 7 pages.

Walsh, J. K, et al., "High-Temperature Circuit Boards for Use in Geothermal Well Monitoring Applications," Materials Challenges in Alternative andRenewable Energy II: Ceramic Transactions, Edited by George Wicks et al., 2013, John Wiley & Sons, Inc., 11 pages.

Yafune, N. et al., "AlN/AlGaN HEMTs on AlN substrate for stable high-temperature operation," Electronics Letters, vol. 50, No. 3, Jan. 30, 2014, pp. 211-212.

Yamate, T. et al., "Optical Sensors for the Exploration of Oil and Gas," Journal of Lightwave Technology, vol. 35, No. 16, Aug. 15, 2017, 8 pages.

Helali, A. et al., "Small signal modeling of HEMTs AlGaN/GaN/SiC for sensor and high-temperature applications," Elsevier Optik, vol. 127, 2016, pp. 7881-7888.

HIGH TEMPERATURE AND HIGH PRESSURE ALGAN/GAN ELECTRONICS

CROSS-REFERENCE TO RELATED APPLICATION

This application claims priority under 35 U.S.C. § 119 to U.S. Provisional Patent Application No. 62/780,018 filed on 14 Dec. 2018, the contents of which are hereby incorporated by reference in their entirety.

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory. The government has certain rights in this application.

BACKGROUND

As oil and gas drilling goes deeper in search of natural gas, bottom-hole environmental conditions are reaching 250° C. and 30,000 psi (such as in shallow-water drilling in the Gulf of Mexico). Conditions are also frequently corrosive, involving hydrogen sulfide and carbon dioxide, for example. Similarly, in geothermal drilling, downhole conditions can easily exceed 250° C. and reach 400° C. in extreme cases (such as geysers and near volcanic operations). If anyone is going to economically develop geothermal energy as a significant alternative energy resource, it is essential to improve drilling performance for geothermal wells by reducing the number of bit trips, drilling faster, and accurately steering the direction of the wellbore. An example of steering the direction of the wellbore is horizontal boring which can significantly increase the surface area of the well that is in hot rocks. Currently, all downhole sensors used to improve the performance in oil well drilling have a maximum temperature limit of from about 175° C. to about 225° C., with their reliability significantly reduced above 175° C. To improve the performance of geothermal wells, there is a need to create a stable drilling environment, which requires understanding drilling dynamics in hard crystalline igneous and metamorphic rocks. Ultimately, a set of electronics and sensors capable of delivering the datasets at temperatures up to 400° C. or higher is needed.

Geothermal drilling is plagued by non-productive time related to lost circulation, tripping for the drill bit, low penetration rates, and damaging drilling dynamics. Optimizing geothermal drilling can reduce non-productive time by 50% through employing sensing and electronics technologies demonstrated effective in oil and gas drilling but at 250° C. or higher.

Current downhole sensor technology for drilling is limited by temperature to about 150° C. (and 175° C. at the upper limit) and pressure to about 20,000 psi for required reliability. Thus, deployment is prevented in more extreme environments.

As oil and gas drilling goes deeper, conditions of 250° C. and 30,000 psi and corrosive environments are frequently encountered. Geothermal drilling often encounters 250° C., with temperatures reaching above 400° C. in extreme cases.

Drilling optimization equipment such as Baker Hughes' CoPilot and Schlumberger's OptiDrill and NOV's enhanced measurement system (EMS) tool allow for real-time management of downhole conditions by providing comprehensive drilling dynamics data near the drill bit. Information such as weight on bit, rotational speeds, and vibration are accurately measured, allowing for early diagnosis and correction of problems related to dynamics, weight transfer, and hydraulics. Drilling optimization equipment, normally used in harsh environments, is only rated to a maximum temperature of 302° F. (150° C.). This temperature range is sufficient for standard oil and gas operations.

The functional limit in active devices is about 150° C. for devices based on Si, SiC, and $SiO_2$. Dielectric materials can barely make the current 150° C. limit due to grain-boundary and ion-migration effects. To date, work by Baker Hughes GE, Schlumberger, and Frialit-Degussa show that some active materials such as SiC and packaging can potentially perform at higher temperatures, but the integration process has not been accomplished to even reach a reliable 175° C., much less the ultimately desired temperature of 250° C. or above.

SUMMARY

In an aspect, disclosed herein is a device useful for downhole sensors and electronics suitable for the harsh thermal and mechanical environment associated with high-temperature geothermal drilling and high-temperature/high-pressure oil and gas drilling. In an embodiment, the device contains electronics and sensor packages based on high-temperature AlGaN/GaN coupled with new oxide and composite packaging, that can operate to at least 250° C. and potentially to 400° C. in the mechanical and chemical environment downhole.

In an aspect, disclosed herein is a method for making materials; integrated packaging requirements for the materials development; and tailored materials properties and package design for compatibility with bottom-hole assemblies and/or drill-bit technology. In an embodiment, the method uses packaged AlGaN/GaN electronics that will survive downhole thermo-mechanical environments such as integrated sensor packages and discrete power transistors. In an embodiment, the method uses packaged $Ga_2O_3$/GaN electronics that will survive downhole thermo-mechanical environments such as integrated sensor packages and discrete power transistors. In an embodiment, the method uses material comprising $Ga_2O_3$. In an embodiment, the method uses material comprising SiC. In another embodiment, the method uses packaged SiC/GaN electronics that will survive downhole thermo-mechanical environments such as integrated sensor packages and discrete power transistors.

In an aspect, disclosed herein is a method for measuring high-temperature downhole tools to improve geothermal drilling as well as oil and gas drilling in harsh environments where sensing is necessary.

In an aspect, disclosed herein is a device comprising a transistor capable of operating from 250° C. to 400° C. In an embodiment, the device is capable of operating at pressures greater than 20,000 psi. In an embodiment, the device is capable of operating while experiencing a mechanical shear force of up to 100×g. In an embodiment, the device is capable of operating at pressures greater than 20,000 psi while experiencing a mechanical shear force of up to 100×g. In an embodiment, the device is capable of making measurements comprising wellbore azimuth, wellbore inclination, gravity toolface, magnetic toolface, vibration monitoring, along-string measurements, downhole weight, downhole torque, and gamma-ray detection. In an embodiment, the transistor comprises AlGaN/GaN. In another embodiment, the e transistor comprises $Ga_2O_3$/GaN. In an embodiment, the transistor comprises SiC/GaN. In an embodiment, the transistor comprises a heterostructure field-effect transistor or a double-heterostructure field-effect transistor. In an embodiment, the transistor is capable of exhibiting breakdown voltages of greater than one kilovolt.

In an aspect, disclosed herein is a method for making measurements comprising the use of a transistor capable of operating at temperatures from 250° C. to 400° C. In an embodiment, the transistor is capable of operating at pressures greater than 20,000 psi. In an embodiment, the transistor is capable of operating at a mechanical shear force of up to 100×g. In an embodiment, the transistor is capable of operating at pressures greater than 20,000 psi while experiencing a mechanical shear force of up to 100×g. In an embodiment, the measurements comprise wellbore azimuth, wellbore inclination, gravity toolface, magnetic toolface, vibration monitoring, along-string measurements, downhole weight, downhole torque, and gamma-ray detection. In an embodiment, the transistor comprises AlGaN/GaN. In an embodiment, the transistor comprises $Ga_2O_3$/GaN. In another embodiment, the transistor comprises SiC/GaN. In an embodiment, the transistor comprises a heterostructure field-effect transistor or a double-heterostructure field-effect transistor. In an embodiment, the transistor is capable of exhibiting breakdown voltages of greater than one kilovolt.

DETAILED DESCRIPTION

Figure 1:
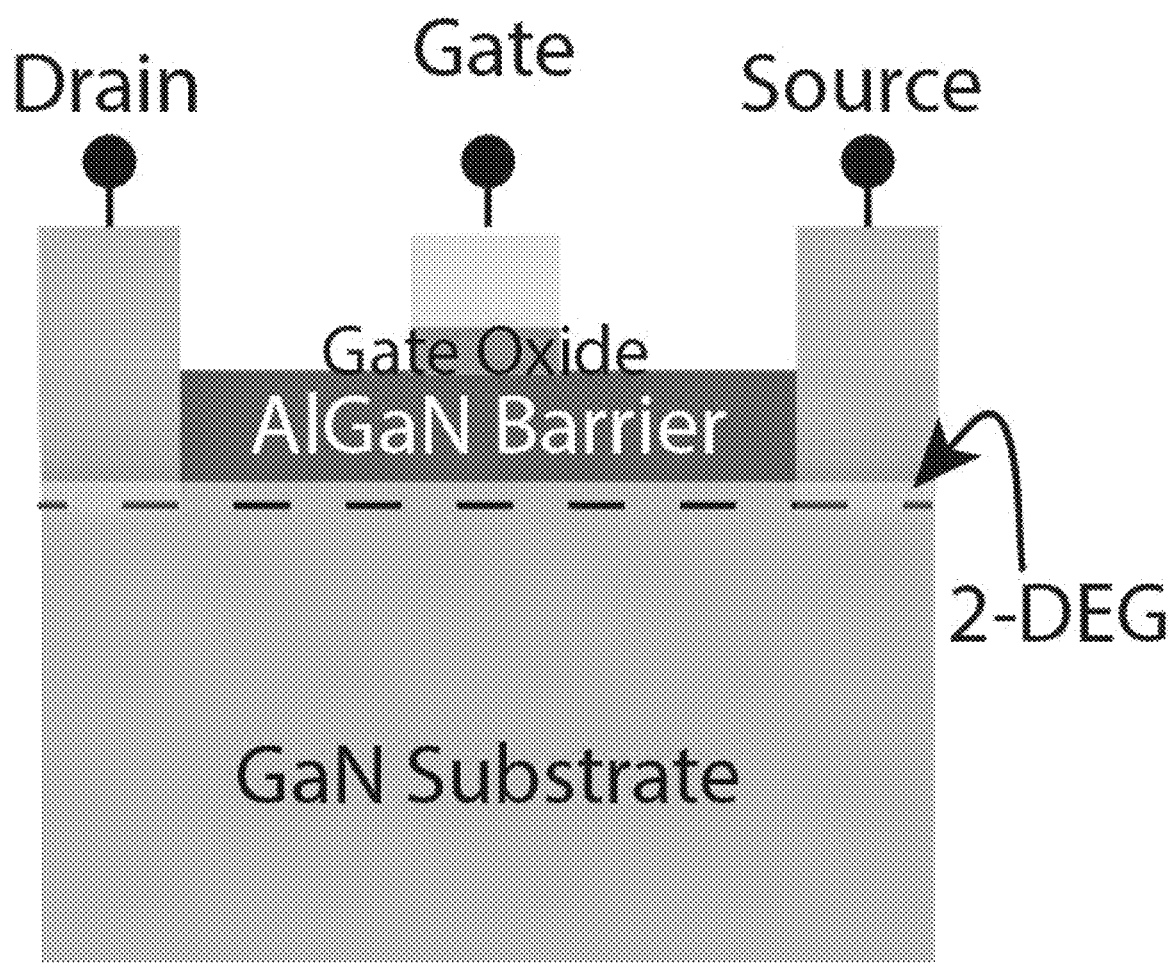
FIG. 1 is a schematic depiction of an AlGaN/GaN HEMT transistor.

Disclosed herein are methods, systems and devices to improve the temperature and environmental capabilities of operational equipment for drilling under high temperature and high pressure.

Disclosed herein are new technologies of downhole sensors and electronics suitable for the harsh thermal and mechanical environment associated with high-temperature geothermal drilling and high-temperature/high-pressure oil and gas drilling. In an embodiment, disclosed herein are smart electronics and sensor packages based on high-temperature AlGaN/GaN coupled with oxide and composite packaging, that can operate to at least 250° C. and potentially to 400° C. in the mechanical and chemical environment downhole. In an embodiment, disclosed herein are smart electronics and sensor packages based on high-temperature $Ga_2O_3$/GaN coupled with oxide and composite packaging, that can operate to at least 250° C. and potentially to 400° C. in the mechanical and chemical environment downhole. In an embodiment, disclosed herein are smart electronics and sensor packages based on high-temperature SiC/GaN coupled with oxide and composite packaging, that can operate to at least 250° C. and potentially to 400° C. in the mechanical and chemical environment downhole. In an embodiment, methods are disclosed herein for a manufacturable strategy for these materials; integrated packaging requirements for the materials development; and tailored materials properties and package design for compatibility with bottom-hole assemblies and/or drill-bit technology. In another embodiment, disclosed herein are packaged AlGaN/GaN, $Ga_2O_3$/GaN or SiC/GaN coupled electronics that will survive downhole thermo-mechanical environments such as integrated sensor packages and discrete power transistors. In an embodiment, the AlGaN/GaN, $Ga_2O_3$/GaN or SiC/GaN coupled electronics disclosed herein are capable of operation in a combination of temperature up to 400° C., pressure to more than 20,000 psi, and mechanical shear of up to 100×g (one hundred times the force of gravity).

Measurements needed for high-temperature downhole tools to improve geothermal drilling as well as oil and gas drilling in harsh environments where sensing is necessary or highly desirable include wellbore azimuth and inclination, gravity toolface or magnetic toolface, vibration monitoring and along-string measurements.

In an embodiment, combining wellbore azimuth and inclination measurements with a surface measurement of depth enables knowledge of the physical location of the drill bit. Currently, in most normal-temperature applications below 175° C., these measurements come from three accelerometers in the X, Y, and Z planes and three magnetometers in the same axes. Gyroscopes are possible but may not be practical because they are particularly sensitive to high temperature and vibration.

In an embodiment, gravity toolface or magnetic toolface measurements require the same sensors as above, but are referenced to an orientation line on a steering device above the bit. These measurements are required to change the direction of the bore.

In an embodiment, vibration monitoring includes the specifications of conventional-temperature tools, but with similar capabilities for high-temperature tools.

In addition to sensing pressure such as provided by a 150° C. along-string measurement (ASM) tool, which is pressure-rated to 25,000 psi, in an embodiment, it could also include downhole weight, downhole torque, and background gamma-ray detection. In an embodiment, development of the sensor package includes discrete sensor elements that archive well data and integrate packages with real-time data transmission.

Successfully transforming downhole electronics requires a two-pronged approach: 1) develop new active downhole semiconductor components and 2) apply new packaging strategies for existing and new components with a thermal target of 250° C., but ultimately capable to 400° C., with performance superior to existing active and dielectric technologies.

In an embodiment, downhole sensing and control technologies are based on AlGaN/GaN technology. In another embodiment, downhole sensing and control technologies are based on $Ga_2O_3$/GaN or SiC/GaN technology. AlGaN/GaN transistors can achieve high performance at 250° C. but are ultimately capable of 400° C. in both sensing and power transistor applications. In an embodiment, the performance of the materials' reliability under temperature and pressure is examined and the performance of packaged electronics at the benchtop and downhole applications is also examined by existing methods. Their performance information is used to iteratively improve sensors and electronics suitable for ultimate downhole tests.

For the active components, AlGaN/GaN high-electron-mobility transistor (HEMT) technology (see FIG. 1) will be developed. AlGaN/GaN transistors can operate at 250° C. and to 400° C. or greater. Without being limited by theory, this is because nitride HEMT transistors use a conductive 2-dimensional electron gas (2-DEG) channel that is formed by the differences in polarization at heterointerfaces. This allows the carriers to be formed without introducing dopants that need to be thermally activated, permitting these transistors to be very stable when subject to temperature changes. In another embodiment, HEMT or double-heterostructure field-effect transistor (DHFET)-based technology using AlGaN/GaN transistors in enhancement mode can achieve high performance up to potentially 400° C. with over kilovolt breakdown voltages.

In an embodiment, the materials and fabrication capabilities of nitride semiconductors will demonstrate and test the key electronic and packaging components. Good ohmic contact and gate dielectrics will be investigated for stability at these high temperatures. Contacts with refractory metals will improve long-term stability of the transistors, and in-situ gate dielectrics will be used to reduce current leakage of the devices at high temperature.

AlGaN/GaN will be used to develop contacts and packaging components tailored to the geothermal environment. In an embodiment, new oxide/dielectric materials will be developed by scalable processing such as solution-based processing that will show no fracture and very low ionic migration at up to 300° C. with the desired dielectric properties. In an embodiment, the materials include borosilicate glasses which can be formulated to work at 400° C., and high-dielectric-constant materials such as $ZrSiO_4$ and $SrHfO_2$, both of which have excellent dielectric properties up to 300° C. These materials will serve both as gate dielectrics and packaging/barrier layers. In another embodiment, new materials will be identified computationally. In an embodiment, the materials will be coupled with stable metallizations to enable full circuits capable of high-temperature operation. Thermal and power technologies will develop with thermal and mechanical technologies to test packaged devices in various environments. In addition to packaging, downhole power under the same conditions will be provided such as providing power by batteries.

The highest-energy chemistries initiate thermal runaway at temperatures exceeding 200° C. using traditional electrolytes. However, there are cells that exhibit very stable cycling and little or no thermal instability. These cells demonstrate stabilities up to 250° C., and by replacing both the anode and cathode with materials with lower energy density (graphite by LTO and NMC by LFP), it is possible to further increase the thermal stability to over 350° C. Newer electrolyte formulations will allow for temperatures up to 380° C. Thereby providing all the needed elements downhole.

A common barrier to entry into the geothermal energy production industry is access to reliable and resilient downhole sensor technology. This barrier for entrants is lowered by making technology available that increases the limits of sensing and power electronics. Current technology provides constant wellbore reorientation and undiagnosed drilling problems that lead to days of lost productive time due to a lack of high-quality real-time data. As a result of temperature limitations, use of more advanced sensing and power electronics often leads to failed components and unreliable data. Thus, disclosed herein are devices and methods to improve the reliability and reduce the limitations of downhole sensor technologies useful for geothermal drilling environments.

In an embodiment, disclosed herein are new materials set for active and passive circuit elements for downhole sensor and power electronics that are capable of higher performance and longer life than existing materials and that have a demonstrated operation at a minimum of 250° C., which is well above the current limit of 150° C. Thus, disclosed herein are new materials suitable for extreme environments such as downhole applications that enable the transition of the materials set for electronics in a geothermal environment. Processing, modeling, and characterizing new materials disclosed herein will lead to improvements of their physical characteristics and increase their utility in extreme environments.

The direct development of sensing and power electronics capable of sustained reliable operation from 250° C. to 400° C. as disclosed herein results in practical and improved downhole systems for geothermal power production in both drilling and monitoring. Modeling shows that a time savings of more than 50% will be achieved with the drilling technologies disclosed herein, and this has significant implications for cost and energy savings. In another embodiment, geothermal wells that can be drilled directionally, enable wells to be drilled from currently inaccessible locations; and enables multiple wells to be drilled from a single location; and enables high-angle or horizontal wells to be drilled, which greatly increase the surface area of hot rock exposed; and enable multilateral wells to be drilled that create downhole radiators.

Beyond geothermal drilling, successful demonstration of high-temperature sensors and power electronics will have similar benefits in oil and gas drilling and other non-drilling, high-temperature environments such as automotive and avionic applications.

Advanced Photon Source (APS) that have been developed to image the defects and interfaces will be used to examine the unpackaged and packaged AlGaN/GaN devices. This will provide both a baseline for materials quality and the interfacial and bulk defects. To initiate the studies to probe reliability, the devices will be examined under a number of stresses. The combination of temperature to 400° C., pressure to more than 20,000 psi, and mechanical shear of up to 100×g will require new insight into degradation mechanisms and complex electronic interfaces. The new tools developed will be well suited to analyze devices with and without dielectric packaging as a function of temperature and pressure, both after cycling and in-situ. This testing is key when coupled to initial testing combining thermal and mechanical stressors. This will provide insight to the stability of the electrical properties, especially the contacts and dielectric active elements. Testing performed on devices at temperature indicate that they are stable.

In an embodiment, very high mobility, stable AlGaN/GaN transistors are disclosed herein that have developed regrown ohmic contacts that offer stability at elevated temperature. In another embodiment, $Ga_2O_3$/GaN and SiC/GaN transistors are disclosed herein that have developed regrown ohmic contacts that offer stability at elevated temperature. They will provide transistor lots that can be used to rapidly evaluate appropriate transistor characteristics and packaging strategies.

Tools that are useful in initial evaluation of drilling packages include the Apache Drill, a Sandvik DE130 coring rig that is instrumented with high-data-rate sensors for drilling performance measurements of downhole sensors as disclosed herein. The testing of new drill bits to six inches in diameter can be performed at experimental mines.

In an embodiment, the technology disclosed herein is useful for drilling and extraction to help minimize risk, increase uptime, and improve performance; to enhance drilling performance at a rig, both on land and offshore; and to offer opportunities around hydraulic fracture stimulation, wellbore intervention; and to serve well intervention service providers, oil and gas producers, pursues equipment, composite tubulars, pumps, floating production systems, and subsea production technologies.

Figure 2:
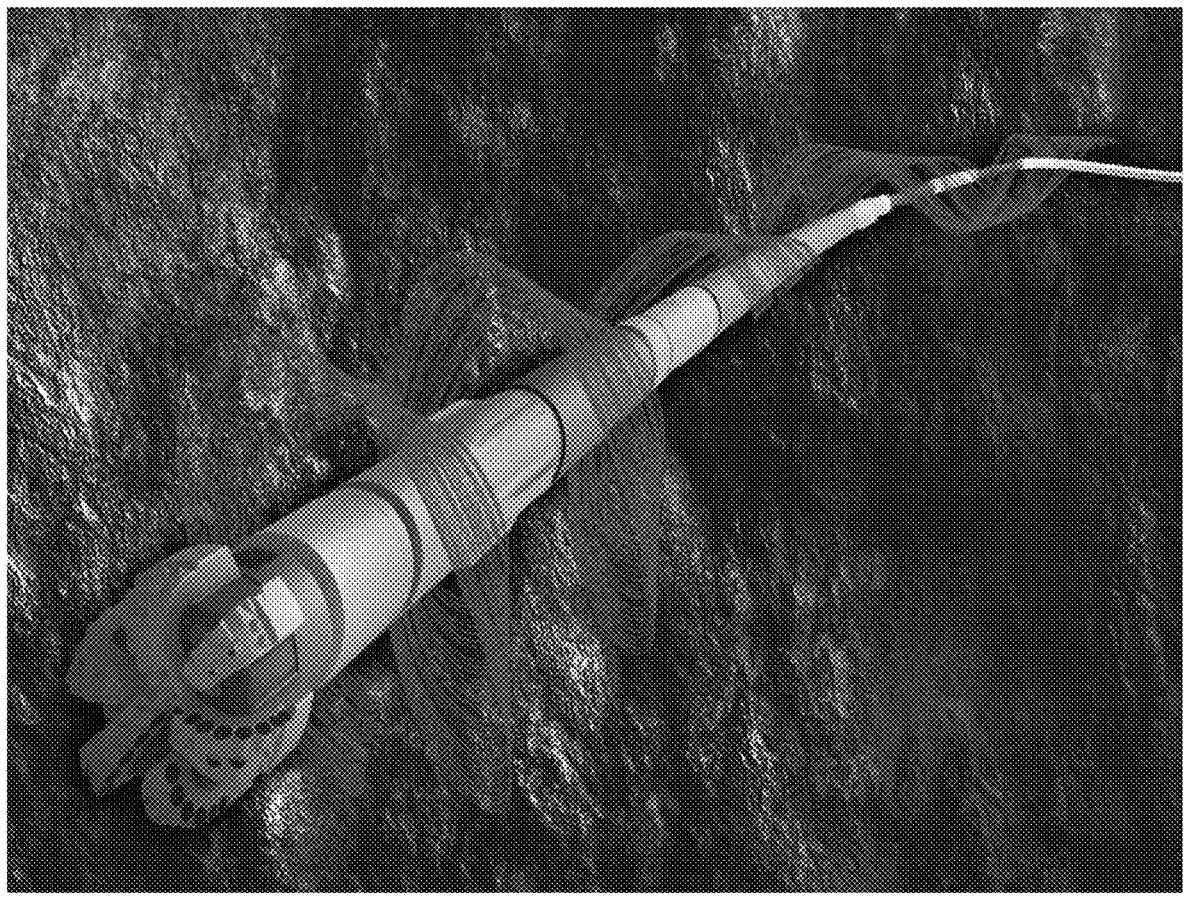
FIG. 2 depicts an embodiment of an AlGaN/GaN HEMT transistor sensor as part of a sensor package on a drill.

Disclosed herein are smart systems that can handle the complex drilling dynamics. As an example, the BlackBox Eclipse sensor package for smart articulated drilling (see, for example, FIG. 2), provides a starting platform for the integration of the AlGaN, $Ga_2O_3$ or SiC sensors. In an embodiment, sensor and control modules are integrated and produced that use high-temperature AlGaN/GaN elements. In another embodiment, sensor and control modules are integrated and produced that use high-temperature $Ga_2O_3$/GaN or SiC/GaN elements.

In another embodiment, geosteering assemblies within subsurface test wells are disclosed that are designed to mimic real-world downhole conditions at temperatures above 250° C.

In another embodiment, dielectric materials based on borosilicate glass are disclosed.

In an embodiment, methods and compositions for AlGaN, $Ga_2O_3$ or SiC materials growth to packaged downhole electronics in smart dynamic drills are disclosed.

In another embodiment, disclosed herein is a data platform that will allow archiving and mining of open materials and theory data and all controlled access to data. In an embodiment, high-performance computing is used to establish a database and access plan to construct coupled experimental and theoretical databases and archives, build data mining API and having protocols for controlled and proprietary access control.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

Other objects, advantages, and novel features of the present invention will become apparent from the detailed description of the invention when considered in conjunction with the accompanying drawings and claims.

What is claimed is:

1. A device comprising a transistor capable of operating from 250° C. to 400° C. and at pressures greater than 20,000 psi.

2. The device of claim 1 capable of operating while experiencing a mechanical shear force of up to 100×g.

3. The device of claim 1 capable of making measurements comprising wellbore azimuth, wellbore inclination, gravity toolface, magnetic toolface, vibration monitoring, along-string measurements, downhole weight, downhole torque, and gamma-ray detection.

4. The device of claim 1 wherein the transistor comprises AlGaN/GaN.

5. The device of claim 1 wherein the transistor comprises $Ga_2O_3$/GaN.

6. The device of claim 1 wherein the transistor comprises SiC/GaN.

7. The device of claim 1 wherein the transistor comprises a heterostructure field-effect transistor or a double-heterostructure field-effect transistor.

8. The device of claim 1 wherein the transistor is capable of exhibiting breakdown voltages of greater than one kilovolt.

\* \* \* \* \*